(12) United States Patent
Cheng et al.

(10) Patent No.: US 8,828,824 B2
(45) Date of Patent: Sep. 9, 2014

(54) III-V FIELD EFFECT TRANSISTORY (FET) AND III-V SEMICONDUCTOR ON INSULATOR (IIIVOI) FET, INTEGRATED CIRCUIT (IC) CHIP AND METHOD OF MANUFACTURE

(75) Inventors: Cheng-Wei Cheng, White Plains, NY (US); Shu-Jen Han, Cortlandt Manor, NY (US); Ko-Tao Lee, White Plains, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 781 days.

(21) Appl. No.: 13/074,878

(22) Filed: Mar. 29, 2011

(65) Prior Publication Data
US 2012/0248502 A1  Oct. 4, 2012

(51) Int. Cl.
*H01L 21/336* (2006.01)

(52) U.S. Cl.
USPC .................. 438/285; 257/192; 257/E21.441; 257/E29.255

(58) Field of Classification Search
USPC ........................................ 257/192; 438/285
See application file for complete search history.

(56) References Cited

U.S. PATENT DOCUMENTS 7,151,296 B2 * 12/2006 Wu et al. ...................... 257/328

* cited by examiner

*Primary Examiner* — Marvin Payen
(74) *Attorney, Agent, or Firm* — Law Office of Charles W. Peterson, Jr.; Louis J. Percello, Esq.

(57) ABSTRACT

Field Effect Transistors (FETs), Integrated Circuit (IC) chips including the FETs, and a method of forming the FETs and IC. FET locations define FET pedestals on a layered semiconductor wafer that may include a III-V semiconductor surface layer, e.g., Gallium Arsenide (GaAs), and a buried layer, e.g., Aluminum Arsenide (AlAs). A dielectric material, e.g., Aluminum Oxide (AlO), surrounds pedestals at least in FET source/drain regions. A conductive cap caps channel sidewalls at opposite channel ends. III-V on insulator (IIIVOI) devices form wherever the dielectric material layer is thicker than half the device length. Source/drain contacts are formed to the caps and terminate in/above the dielectric material in the buried layer.

15 Claims, 12 Drawing Sheets

III-V FIELD EFFECT TRANSISTORY (FET) AND III-V SEMICONDUCTOR ON INSULATOR (IIIVOI) FET, INTEGRATED CIRCUIT (IC) CHIP AND METHOD OF MANUFACTURE

CROSS REFERENCE TO RELATED APPLICATION

The present invention is related to U.S. application Ser. No. 13/074,854 "SELF-ALIGNED III-V FIELD EFFECT TRANSISTOR (FET), INTEGRATED CIRCUIT (IC) CHIP AND METHOD OF MANUFACTURE" to Cheng-Wei Cheng et al., filed coincident herewith assigned to the assignee of the present invention and incorporated herein by reference.

BACKGROUND OF THE INVENTION

1. Field of the Invention

The present invention generally relates to III-V semiconductor Field Effect Transistor (FET) manufacture and more particularly to improving yield and reliability in III-V semiconductor chip manufacture.

2. Background Description

An ideal Field Effect Transistor (FET) can be modeled simply as a current source ($I_{sat}$) and a switch. A FET inverter may be modeled simply as a pair of the switches and current sources driving a load modeled as a capacitor ($C_{load}$). This model is valid as long as path resistance and/or device resistance is negligible. Under those conditions, and ignoring any propagation delays, circuit performance is determined by drive current ($I_{sat}$) and load ($C_{load}$), i.e., $I_{sat}=C_{load}dV/dt$. Wiring path resistance and internal device resistances, however, complicate the model and erode performance.

Path and device resistance introduce series resistance into the path. Normal device resistance is either channel resistance or source/drain resistance. Source/drain resistance may be attributed to diffusion resistance, which is the resistance in the source/drain diffusion between the channel and the capacitive load; and contact resistance, i.e., at the typically metal to diffusion connection between the source/drain diffusion and the capacitive load. While the source/drain diffusion may be shortened to reduce diffusion resistance, for example, by locating the load adjacent to the channel (e.g., forming contacts at the gate edges), contact resistance, arguably considered as path resistance, is still present. Because a bare metal to semiconductor contact forms a Schottkey diode, semiconductor manufacturing typically includes steps to form a resistive contact and, simultaneously, minimize contact resistance.

III-V semiconductor (e.g., GaAs, InP, InGaAs and etc.) manufacturing, for example, typically involves alloying metal with the doped semiconductor to form low-resistance contact. Unfortunately, however, absent using difficult process controls that require delicate and precise alloying steps, the contact alloy may penetrate too deeply beyond the diffusion and into underlying the substrate during contact formation, which can cause device shorts, e.g., source/drain to substrate shorts and/or source to drain shorts. These defects in a single transistor can ruin an entire IC chip.

FIG. 1 shows an example of a prior art III-V semiconductor device 50. The device is formed on a semiconductor wafer 52, a Gallium Arsenide (GaAs) wafer in this example. The GaAs wafer 52 includes a body doped substrate 54 (e.g., doped with an N-type dopant) supporting a heavily doped layer 56 (doped in this example with a P-type dopant) and a channel doped surface layer 58 (in this example body with a P-type dopant). Gate oxide 60 and gates 62 on surface layer 58 define the FETs with contacts 64 formed alloying metal with the semiconductor at device (N-type) source/drains at either end of the channels, i.e., either side of gates 62.

As is apparent in this example, the metal contacts 64 formed through the surface layer 58 into the heavily doped layer 56, essentially shorting the contacts to substrate and together. These shorts from deep alloy penetration in the contact area, cause heavy leakage in and to the doped substrate region. This heavy leakage is a very significant current loss for short channel devices and, if large enough may make defective (dis or non-functional) any circuit that includes one or more of the devices.

The state of the art approach requires precisely controlling process time and temperature to control the alloy depth. Unfortunately, while the controlling ambient temperature within a chamber and for a specified period of time may be relatively easy, localized variations within the chamber at contact level, for example, may make it difficult to control the depth and contact profile with uniformity. Consequently, contact profile may vary from contact to contact, wafer site to site, and wafer to wafer. Further, post contact-formation, channel and re-growth materials used may degrade well-formed contacts to increase contact resistance and/or form mis-contacts.

Thus, there exists a need for improved contact formation in III-V semiconductor manufacturing, and more particularly for simplifying low resistance III-V semiconductor contact formation while avoiding contact to substrate and/or channel shorts to improve chip yield and reliability.

SUMMARY OF THE INVENTION

It is a purpose of the invention to improve contact formation in III-V semiconductor manufacturing;

It is another purpose of the invention to simplify low resistance III-V semiconductor contact formation;

It is yet another purpose of the invention to avoid contact to substrate and/or channel shorts while forming low resistance III-V semiconductor contact.

The present invention relates to a Field Effect Transistors (FETs), Integrated Circuit (IC) chips including the FETs, and a method of forming the FETs and IC. FET locations define FET pedestals on a layered semiconductor wafer that may include a III-V semiconductor surface layer, e.g., Gallium Arsenide (GaAs), and a buried layer, e.g., Aluminum Arsenide (AlAs). A dielectric material, e.g., Aluminum Oxide (AlO), surrounds pedestals at least in FET source/drain regions. A conductive cap caps channel sidewalls at opposite channel ends. III-V on insulator (IIIVOI) devices form wherever the dielectric material layer is thicker than half the device length. Source/drain contacts are formed to the caps and terminate in/above the dielectric material in the buried layer.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 2:
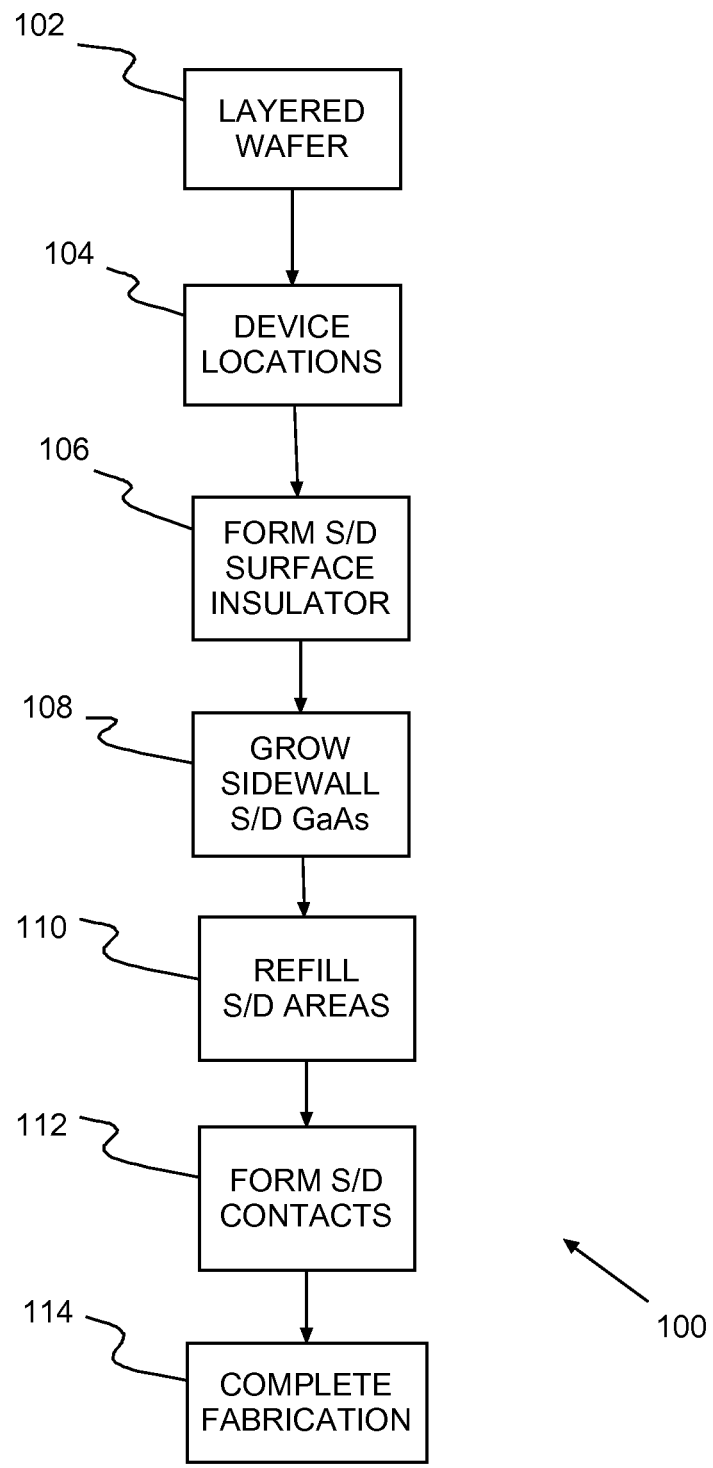
FIG. 2 shows an example of steps in a method for forming device contacts to III-V semiconductor devices according to a preferred embodiment of the present invention.

Turning now to the drawings and, more particularly, FIG. 2 shows an example of steps in a method 100 for forming device contacts to III-V semiconductor Field Effect Transistors (FETs) or devices according to a preferred embodiment of the present invention. In particular, preferred FETs include ohmic metal contacts to source/drain regions that contact channel end sidewalls and are formed on a dielectric layer. The dielectric layer prevents contact metal from penetrating further into the substrate, while insuring that the resistive source/drain contacts remain isolated from the channel and substrate. The isolation prevents shorts that might otherwise occur and improves manufacturing yield and chip reliability.

Fabrication begins 102 with a layered wafer and defining 104 device locations on the wafer. Locations are defined 104 by pedestals on the wafer. Each pedestal is formed by forming an FET gate on the surface; opening the surface layer at, and self-aligned to, the gates; and subetching partially through an underlying buried layer. Oxidizing exposed surfaces of the buried layer replaces 106 at least the surface with an insulating/dielectric layer. Semiconductor caps are regrown 108 on exposed sidewalls of the surface layer and optionally on the surface of the dielectric layer. Then, the subetched source/drain areas are refilled 110 with doped semiconductor to the wafer surface. Conductive contacts are formed 112 in source/drain regions, e.g., metal is alloyed with the source/drain refill. Finally, chip fabrication continues normally 114, connecting devices together to form circuits and wiring circuits together to form chips.

Figure 3:
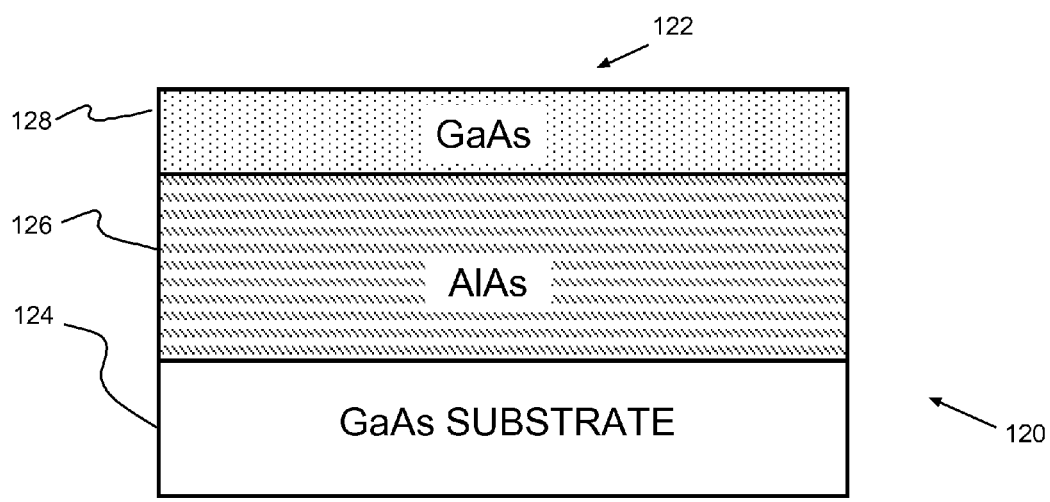
FIG. 3 shows an example of a cross section layered wafer at a device location provided for fabrication.

FIG. 3 shows a cross sectional example of a layered wafer 120 at a device location 122 provided 102 for preferred Integrated Circuit (IC) fabrication with reference to FIG. 2. In this example, the wafer 120 includes a Gallium Arsenide (GaAs) substrate 124, an Aluminum Arsenide (AlAs) buried layer 126 on the GaAs substrate 124, and a GaAs surface layer 128 on the AlAs buried layer 126. Preferably, the AlAs buried layer 126 is thinner than 100 nanometers (nm) thick and most preferably 50 nm thick. Preferably also, the GaAs surface layer 128 is thinner than 100 nm thick and most preferably 10 nm thick.

Figure 4A:
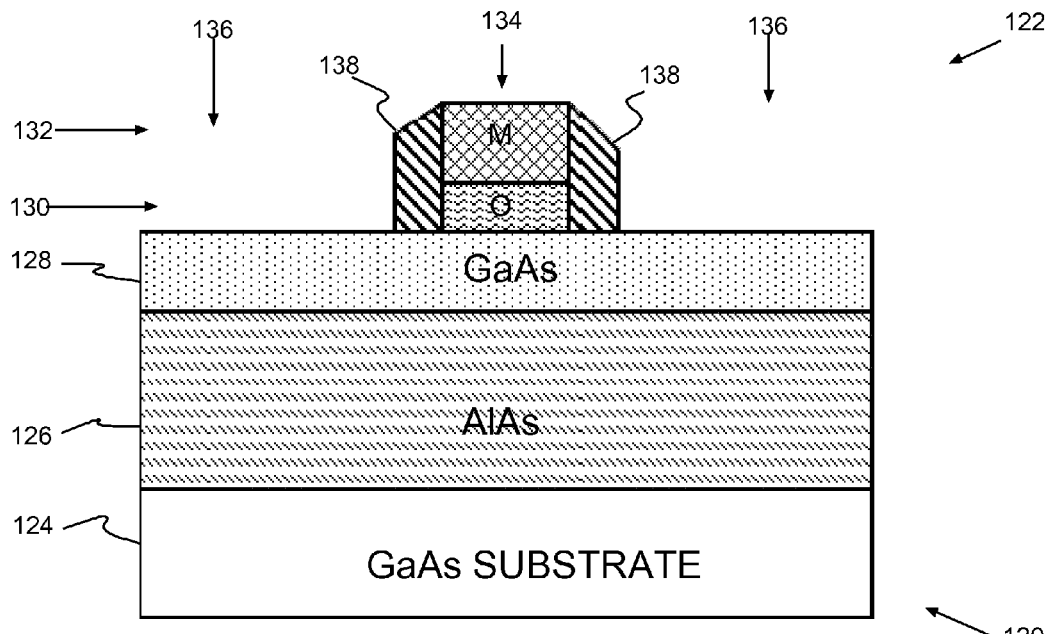
FIGS. 4A-B shows an example of defining device locations on the wafer and opening the surface layer.
Figure 4B:
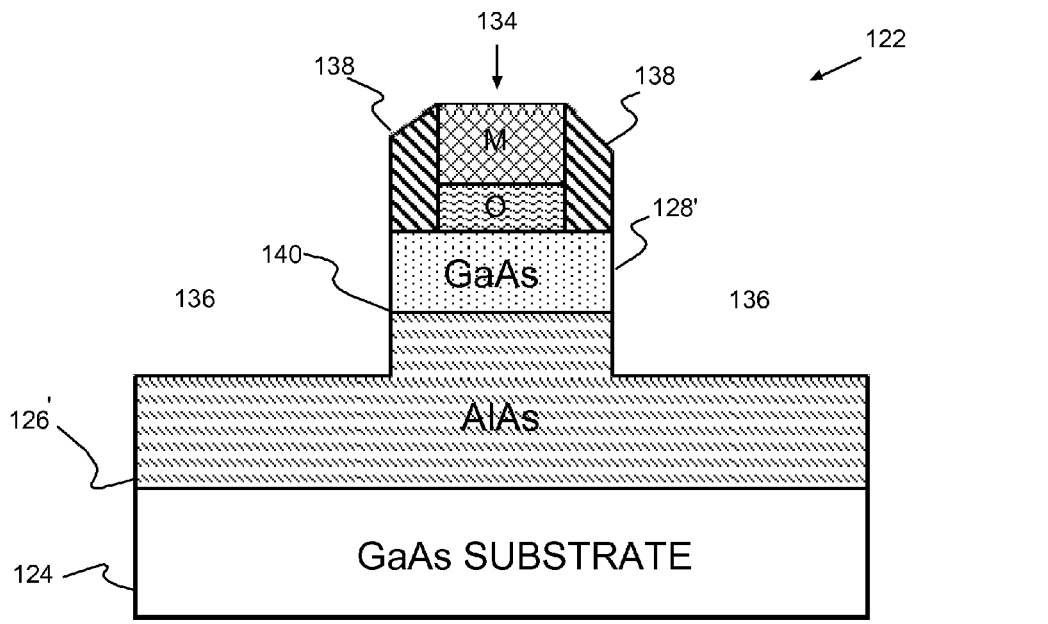

FIGS. 4A-B show an example of defining device locations 122 (104 in FIG. 2) on the wafer 120 surface layer 128. Gate formation begins with forming a gate dielectric layer 130, less than 10 nm thick and preferably 5 nm thick, formed on the surface layer 128. A gate layer 132, e.g., metal thinner than 100 nm thick, and preferably 50 nm thick, is formed on the gate dielectric layer 130. Gates 134 are a suitable conductive material such as TiN, doped SiGe, Si, Tungsten (W) or a combination thereof, patterned, e.g., using typical state of the art photolithographic patterning techniques. The gate dielectric 130, e.g., $HfO_2$, $Al_2O_3$ or $SiO_2$, may be patterned with, before or after patterning the gate layer 132.

The gates 134 define source/drain regions 136 on both sides of each gate 134. Sidewall spacers 138 are formed, less than 100 nm wide and preferably 15 nm wide, along both sides of the gates 134. Sidewall spacers 138 may be formed, for example, by conformally forming a layer of dielectric material, e.g., nitride or oxide, and removing horizontal portions of the conformal dielectric layer, for example, using a reactive ion etch (RIE).

Next, a pedestal 140 is formed on the wafer 120 in device locations 122. The exposed areas (i.e., those areas not under gates 134) of surface layer 128 are removed, e.g., using a wet or dry etch. Removal exposes the AlAs buried layer 126, which are subetched using a controlled wet or dry etch. Preferably, the AlAs buried layer 126 is etched at least to a depth of 10 nm and preferably 5 nm deep, leaving device pedestals 140 extending upward from the recessed AlAs buried layer 126' and supporting device channel layer 128'.

Figure 5A:
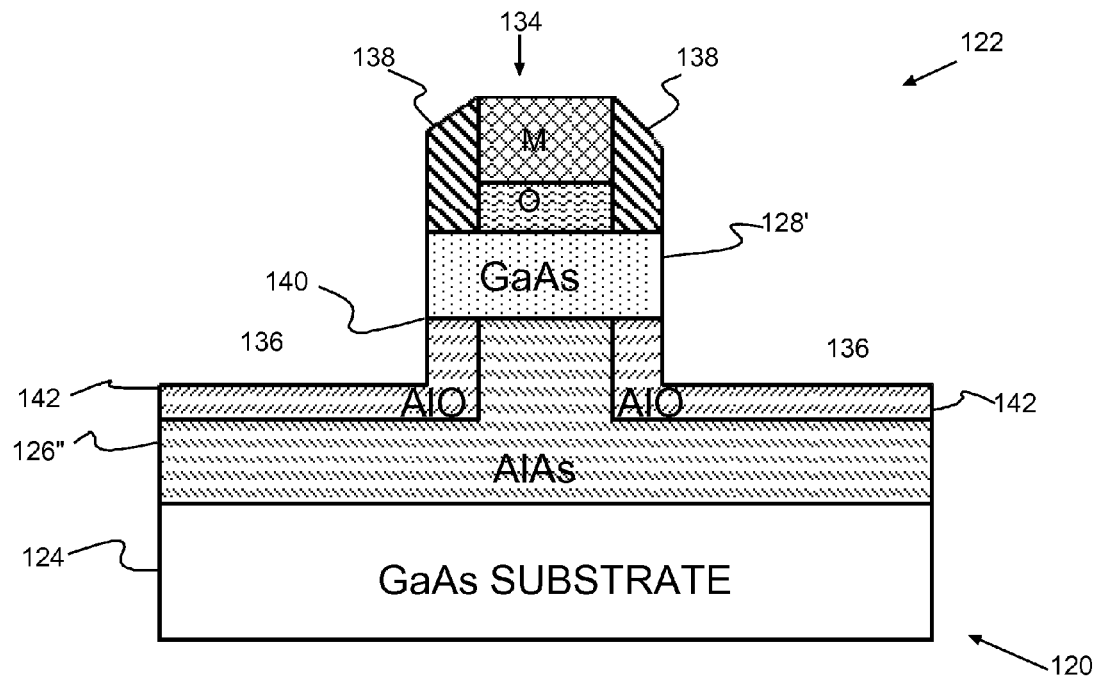
FIGS. 5A-B show the AlAs buried layer after partially or fully oxidize oxidized to replace exposed buried layer with a dielectric at least under the source/drain area where contacts will be formed.

Next, as shown in FIGS. 5A and B, the exposed AlAs buried layer is partially or fully oxidized (106 in FIG. 2) for III-V semiconductor on insulator (IIIVOI) FETs, to convert the exposed surface of buried layer 126" to a dielectric or insulator (AlO) layer 142 at least in device source/drain regions 136 where source/drain contacts are formed. Preferably, the wafer 120 is immersed in an oxidization medium, e.g., oxygen or steam, for a timed oxidization. Since AlAs has a much higher oxidization rate than other exposed materials, e.g., the metal gates 134 or semiconductor 128' sidewall surfaces, the buried layer 126' may be partially or completely oxidized without significant oxidization to those exposed materials. Thus the extent of oxidization can be controlled by time and temperature to partially convert, e.g., oxidizing the AlAs surface to form an oxide (AlO) layer 142 in the source/drain regions 136 on unconverted buried layer 126".

Preferably, the oxide layer 142 is at least 5 nm thick in device 122. Optionally, the oxide layer 142 may be up to 10 nm thick, which in devices that are shorter (including gate sidewall spacers 138) than 20 nm (double the oxide layer 144 thickness, e.g., device 122'), converts the buried layer 126" completely to oxide 144 at least in the pedestals. Thus, for any devices that are shorter than double the selected oxide layer 144 thickness, such as device 122', those devices are semiconductor on oxide devices, i.e., IIIVOI devices. Also, if desired, oxidization may be allowed until all of the buried layer material is converted to oxide under every device such that all devices are semiconductor on oxide (IIIVOI) devices 122'.

Figure 6:
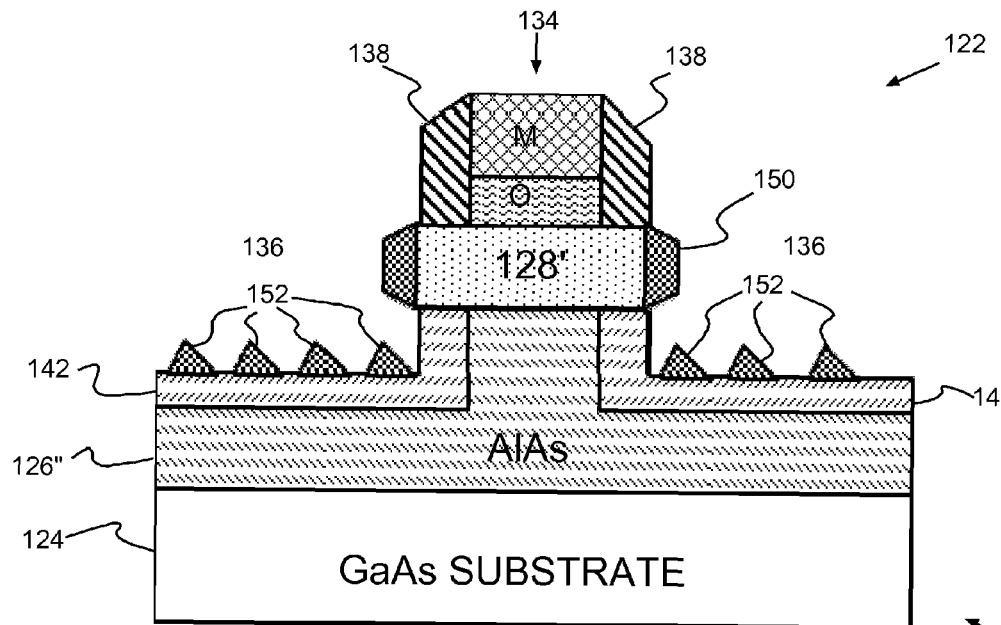
FIG. 6 shows S/D sidewall regrowth.

FIG. 6 shows S/D sidewall regrowth (108 in FIG. 2) for FET 122 example of FIG. 5A. A thin layer of heavily doped GaAs is regrown to form the side contact pads or caps 150 on device channel layer 128' sidewalls. Heavily doped GaAs mat be further distributed 152 on the oxide layer 142, i.e., at the bottom of the device source/drain regions 136.

Figure 7:
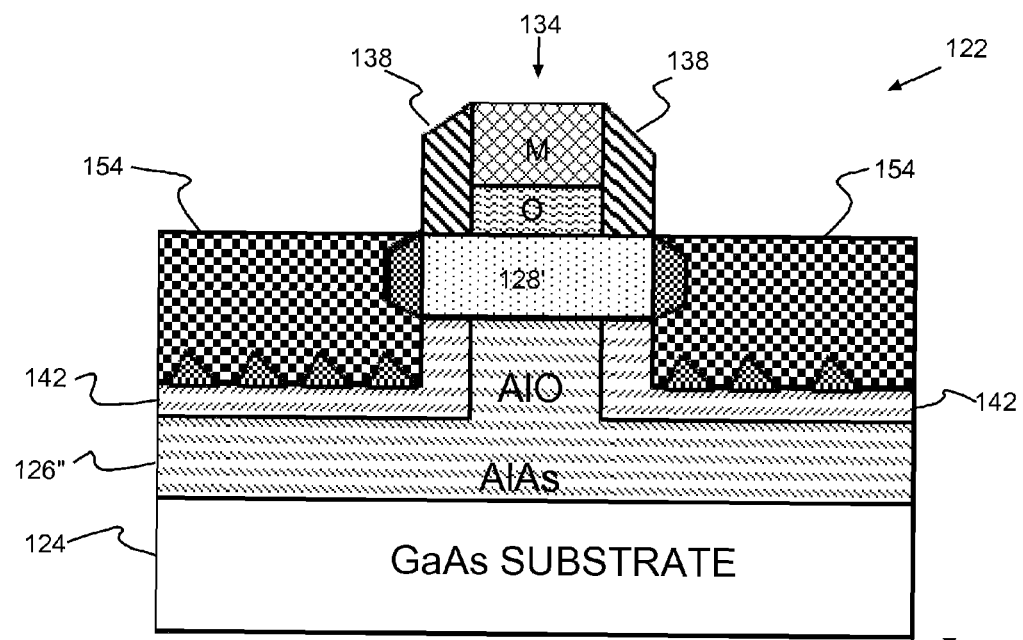
FIG. 7 shows refilling source/drain regions with semiconductor material.

Source/drain regions 136 are refilled (110 in FIG. 2) as shown in FIG. 7. The device source/drain regions are refilled with a heavily doped semiconductor material (more heavily than the source/drain side contact caps 150) that forms source/drain contact regions 154. Preferably, the heavily doped semiconductor material is Indium Arsenide (InAs), InGaAs doped to $10^{19}$~$10^{20}$ (cm$^{-3}$), or any other semiconductor material doped to a level suitable for forming good ohmic source/drain contacts.

Figure 5B:
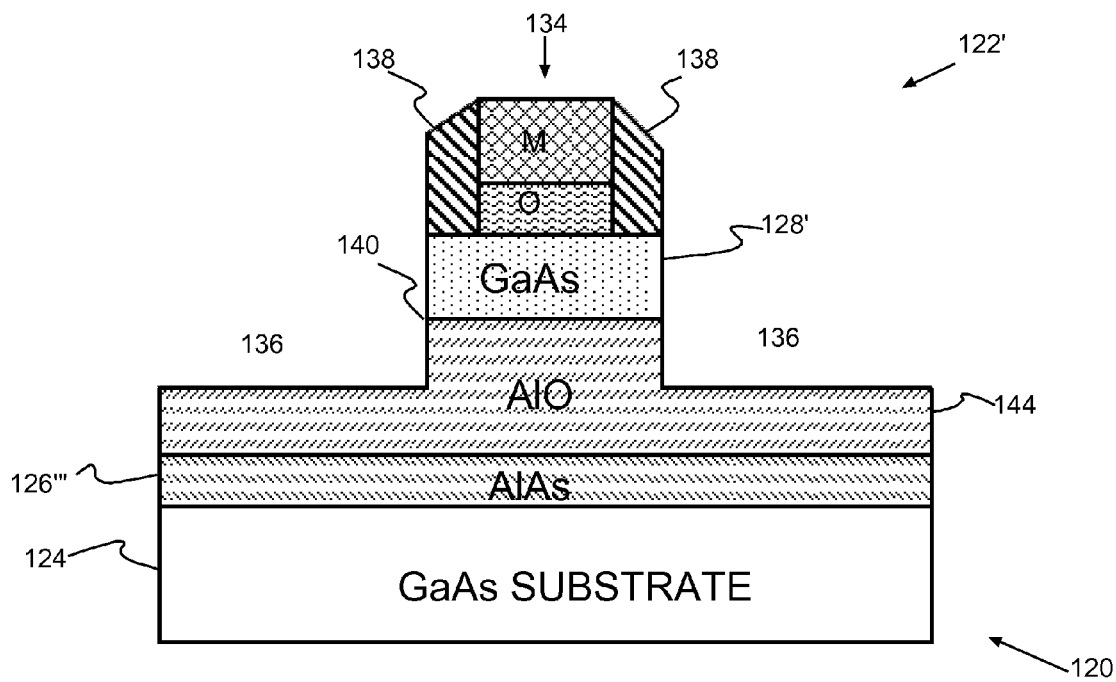

Since this regrowth 108 and refill 110 is post oxidization 106, the extent of oxidization (partially or fully under the preferred FET) has no bearing on regrowth 108 and refill 110, regrowth and refill proceed substantially identically for the IIIVOI FET 122' as for FET 122. Having completed device definition, source/drain contact regions 154 completely reside on dielectric 142 (or 144 in the FET example of FIG. 5B), an interlevel dielectric layer (not shown) may be formed on the wafer and chip fabrication can continue normally, e.g., forming multiple wiring layers through normal Back End of the Line (BEOL) semiconductor manufacturing.

Figure 8A:
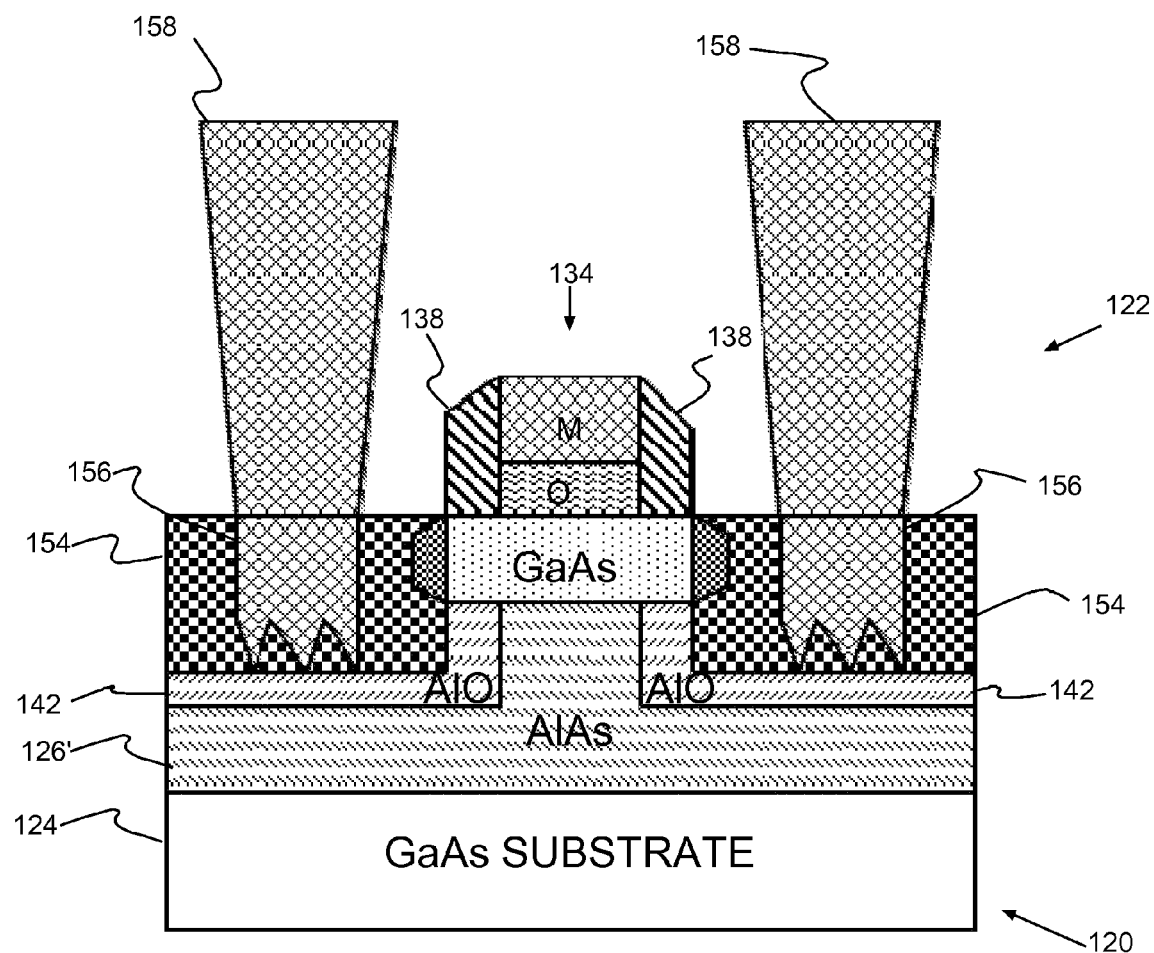
FIGS. 8A-B show contacts and/or through-vias opened through dielectric to and into source/drain regions of FETs for metal contacts.
Figure 8B:
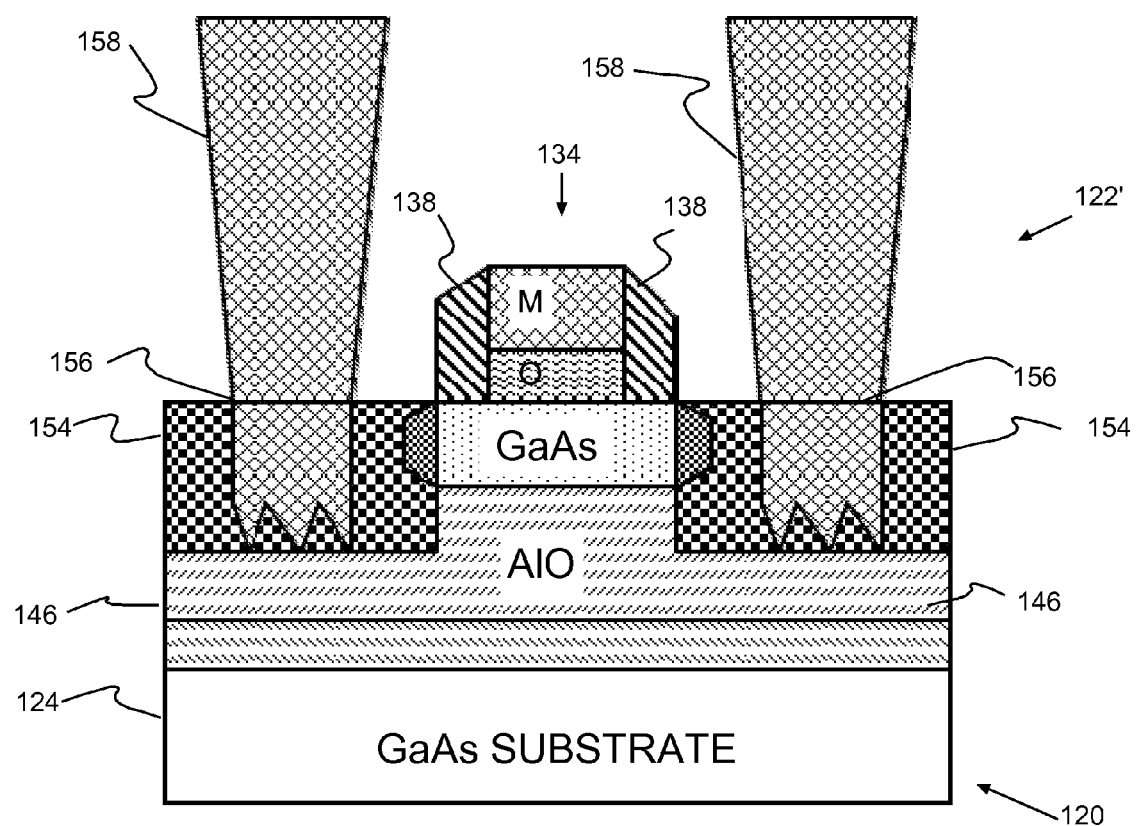

So as shown in FIGS. 8A-B, in 112 of FIG. 2 the interlevel dielectric layer (not shown) is opened for contacts and/or through-vias to and into source/drain contact regions 154. Ohmic source/drain contacts 156 are formed by filling the opened contacts/through-vias with metal and alloying. The alloyed metal forms heavily doped III-V semiconductor source/drain contacts 156. Preferably, the alloyed metal is Gold (Au), Germanium (Ge), Nickel (Ni), an alloy thereof or any other metal suitable for forming ohmic contact to the III-V layers. The heavily doped III-V semiconductor source/drain contacts 156 may extend through the semiconductor layer 128, but do not however, penetrate the underlying dielectric 142, 144. Fabrication continues in 114 connecting the FETs 122 and/or the IIIVOI FET 122' for chip wiring, e.g., metal lines 158 on upper layers, to wire the FETs into chip circuits and chip circuits together.

Figure 9A:
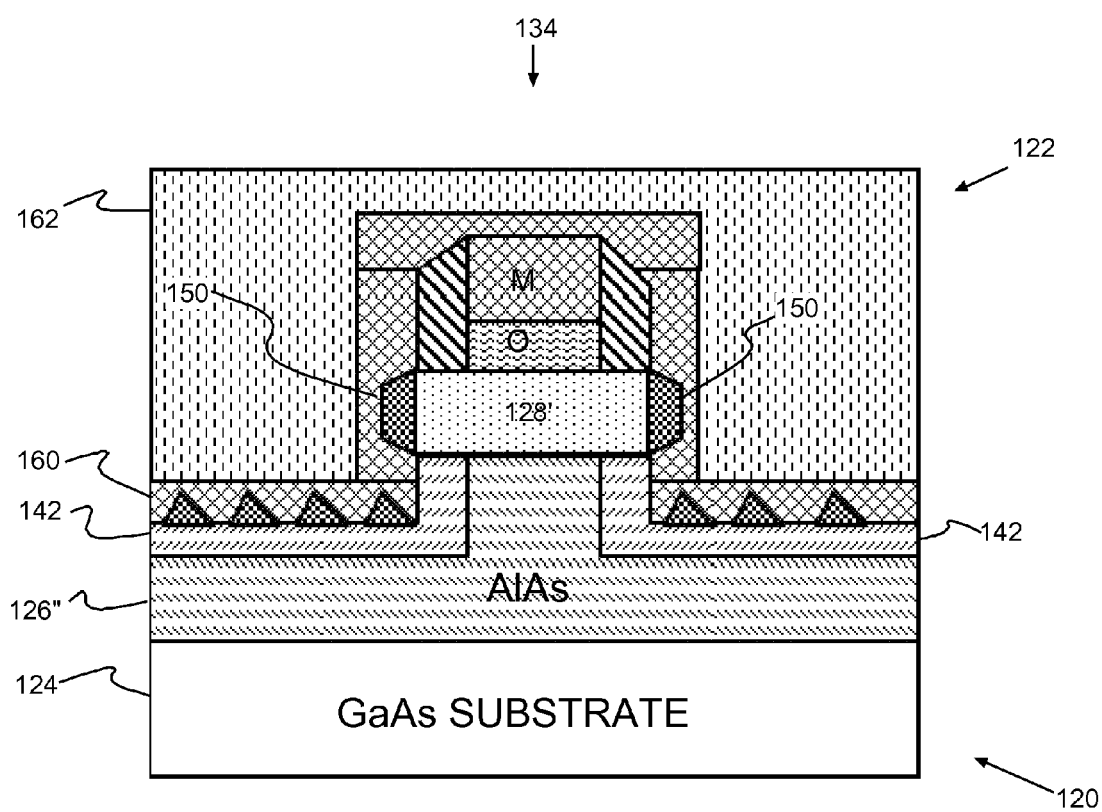
FIG. 9A-B show an optional step in forming contacts according to an alternate embodiment.
Figure 9B:
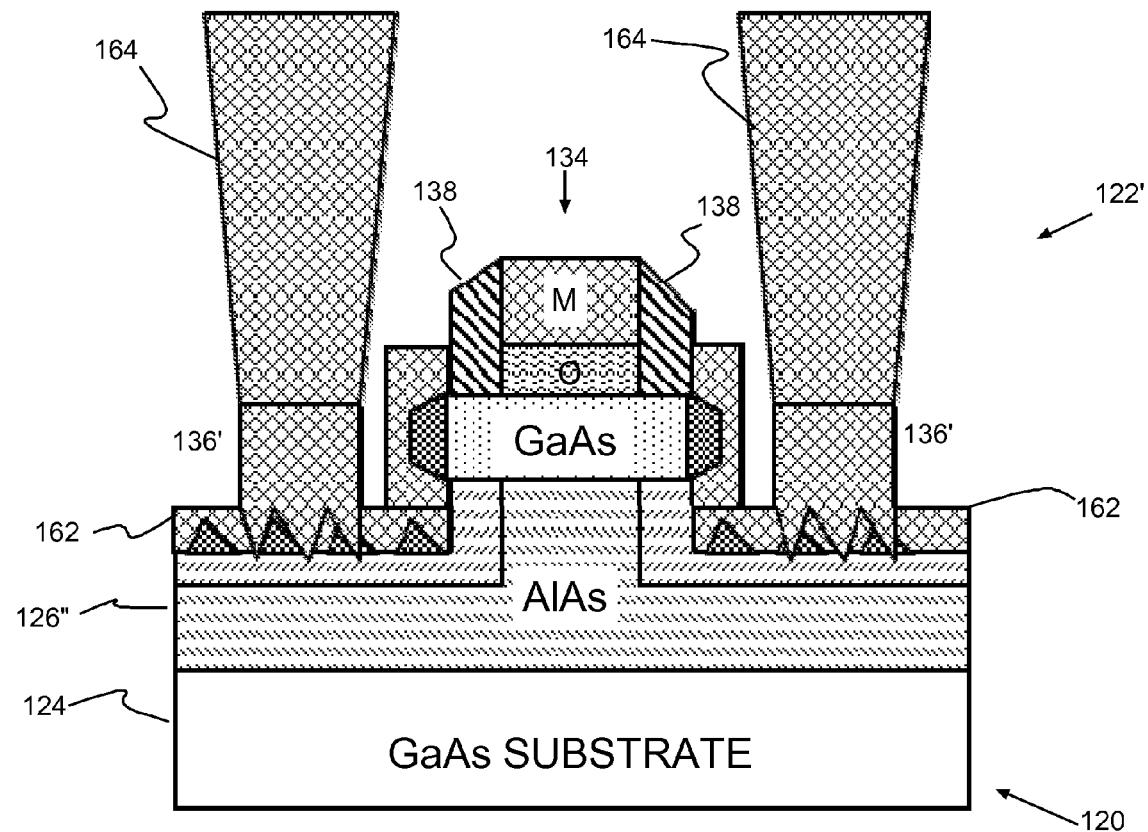

FIG. 9A-B show an optional step in forming contacts according to an alternate embodiment. Essentially, after forming the side contact pads 150 in FIG. 6, a metal layer 160 is conformally formed on the wafer and a polymer hard material layer 162 is deposited on the wafer 100. In this embodiment, the gate 134 is preferably TiN and the conformal metal layer 160 is preferably, molybdenum (Mo), nickel (Ni), aluminum (Al), titanium (Ti), tungsten (W), gold (Au), silver (Ag) or a compound thereof.

The upper portion of the polymer hard material layer 162 is removed at least to the upper edges of sidewalls 138, e.g., using a chemical-mechanical polish (chem-mech polish or CMP) that loosens and removes the polymer but leaves metal 160 undisturbed. So, removal of the polymer upper portion re-exposes the highest areas of metal layer 160, i.e., at least over metal gates 134. Preferably, enough of the polymer upper portion is removed to re-expose a vertical portion, but not all of the metal layer 160 along the sidewalls 138, while the metal layer 160 on pedestal sidewalls including side contact pads 150 remain below the polymer surface.

Then, re-exposed portions of the metal layer 160 are removed, preferably, using an etchant that is selective to the metal layer 160 and gates 134. Alternately, the native oxide of the gate metal provides a barrier to differentiate between the gate and the metal layer during etch. Removing portions the metal layer 160 over the gates 134 electrically separates the gates 134 from the remaining portions 162 (i.e., at source/drain regions 136').

After the portions of the metal layer are removed, the remainder of polymer hard material layer 162 is removed. This leaves source/drain regions 136' lined with metal 162 that form pads. Thereafter, contacts 164 may be made to the metal pads 162, e.g., through dielectric, preferably, through GaAs as described for the first embodiment with reference to FIGS. 7, 8A and B and fabrication proceeds normally.

Figure 10:
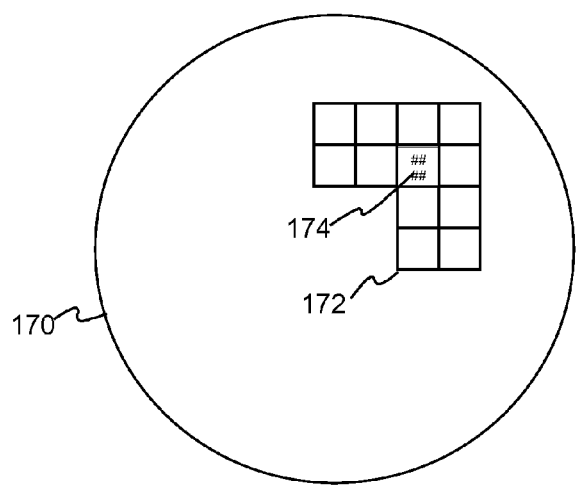
FIG. 10 shows an example of a wafer with chips manufactured according to a preferred embodiment of the present invention.

FIG. 10 shows an example of a wafer 170 with chips 172 manufactured according to a preferred embodiment of the present invention. The chips include connected circuits 174, one or more of which includes at least one preferred FET.

Figure 1:
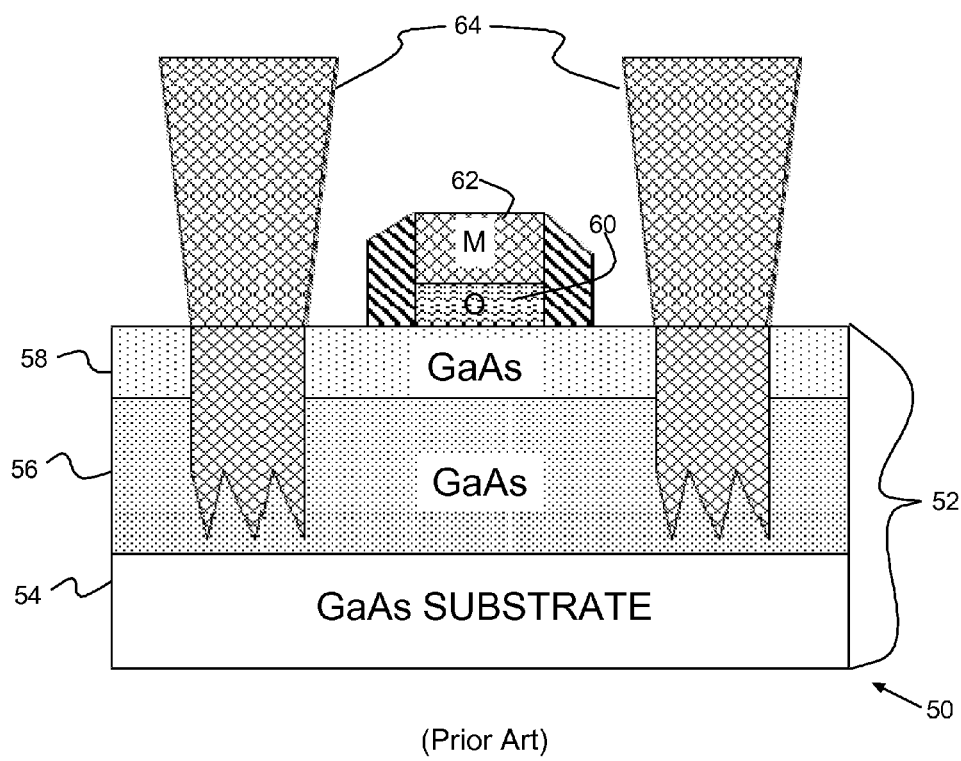
FIG. 1 shows an example of a prior art III-V semiconductor device.
Figure 11A:
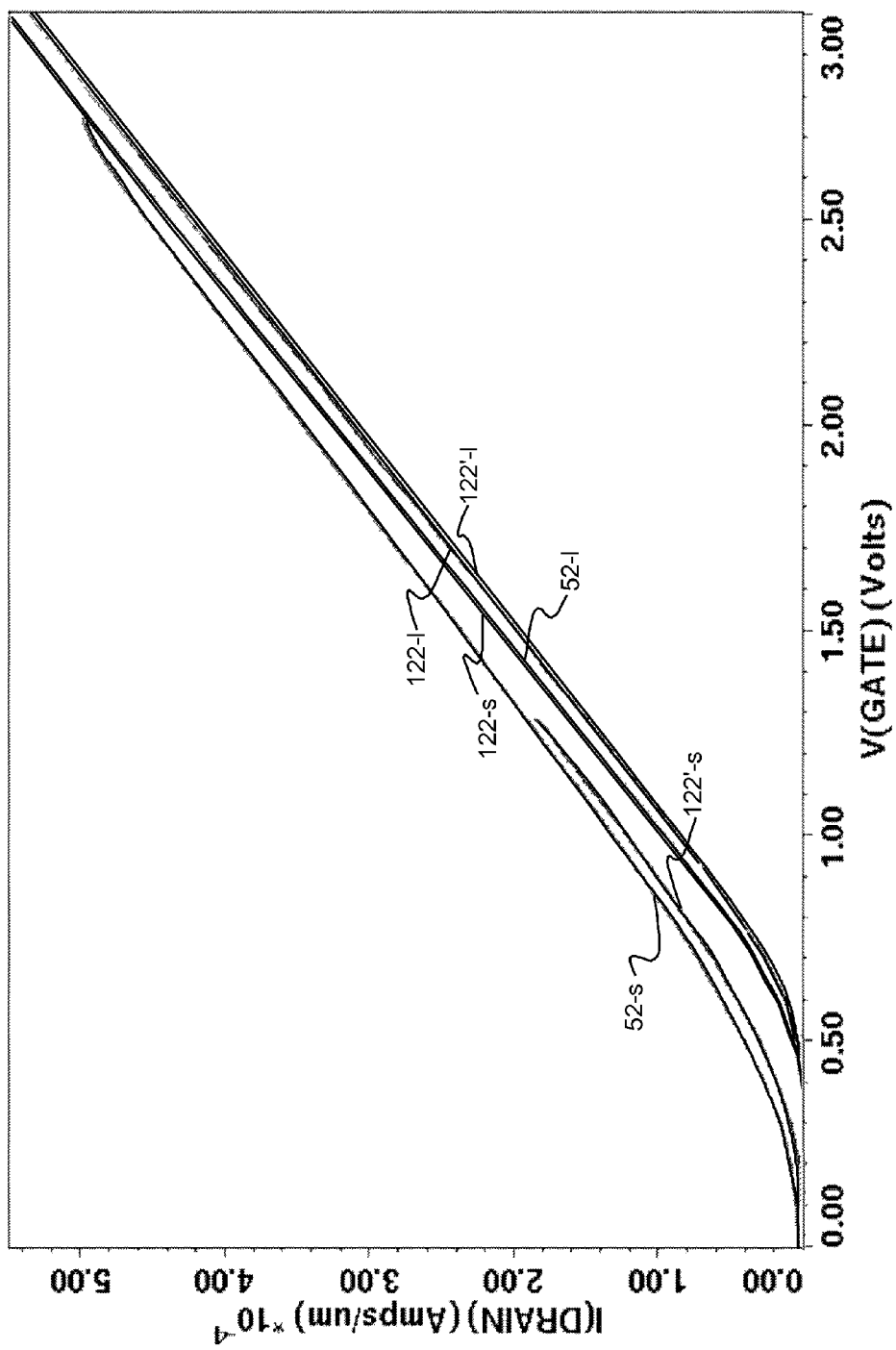
FIGS. 11A-C show a comparison of device I-V characteristics for the preferred devices with the typical state of the art device.
Figure 11B:
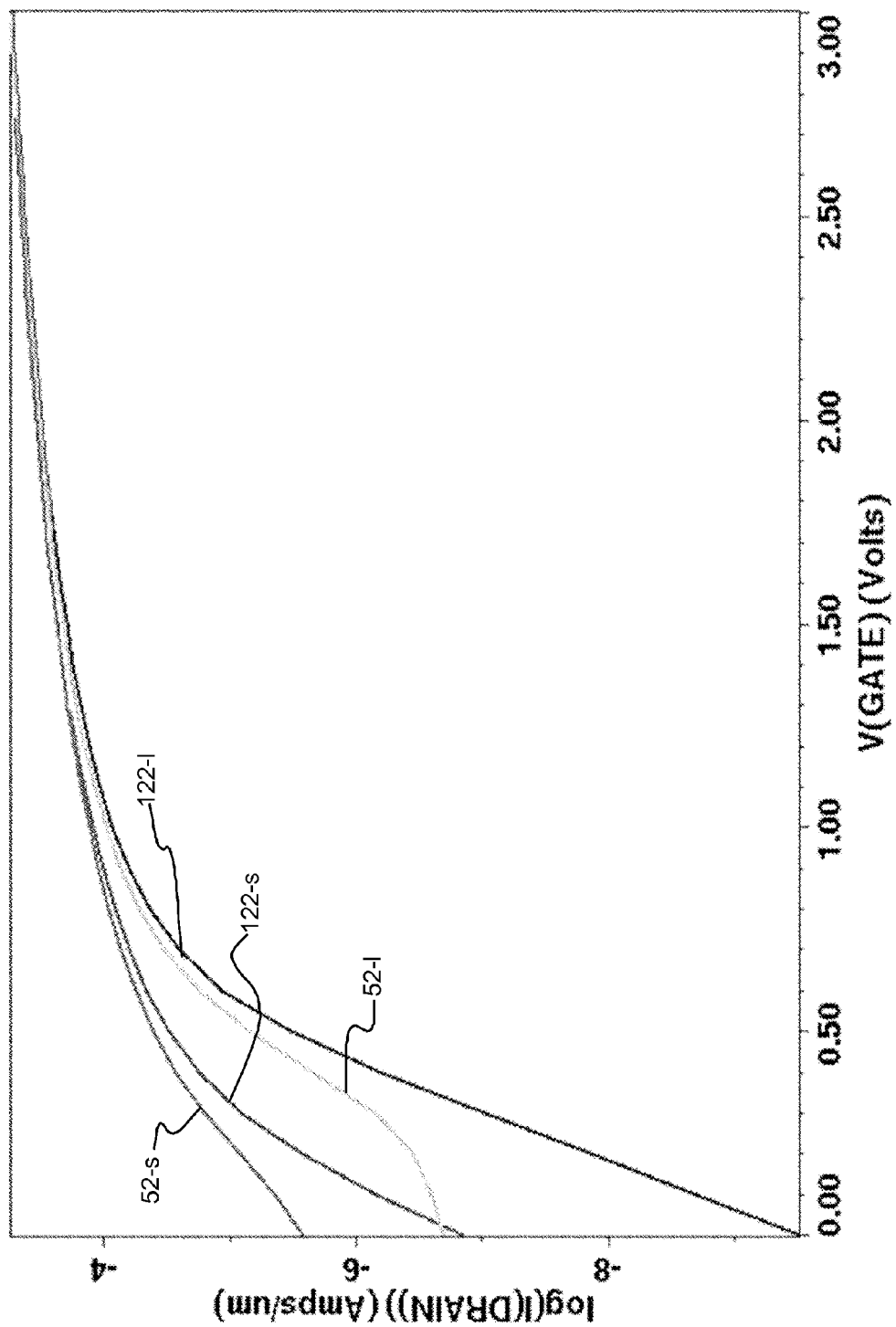
Figure 11C:
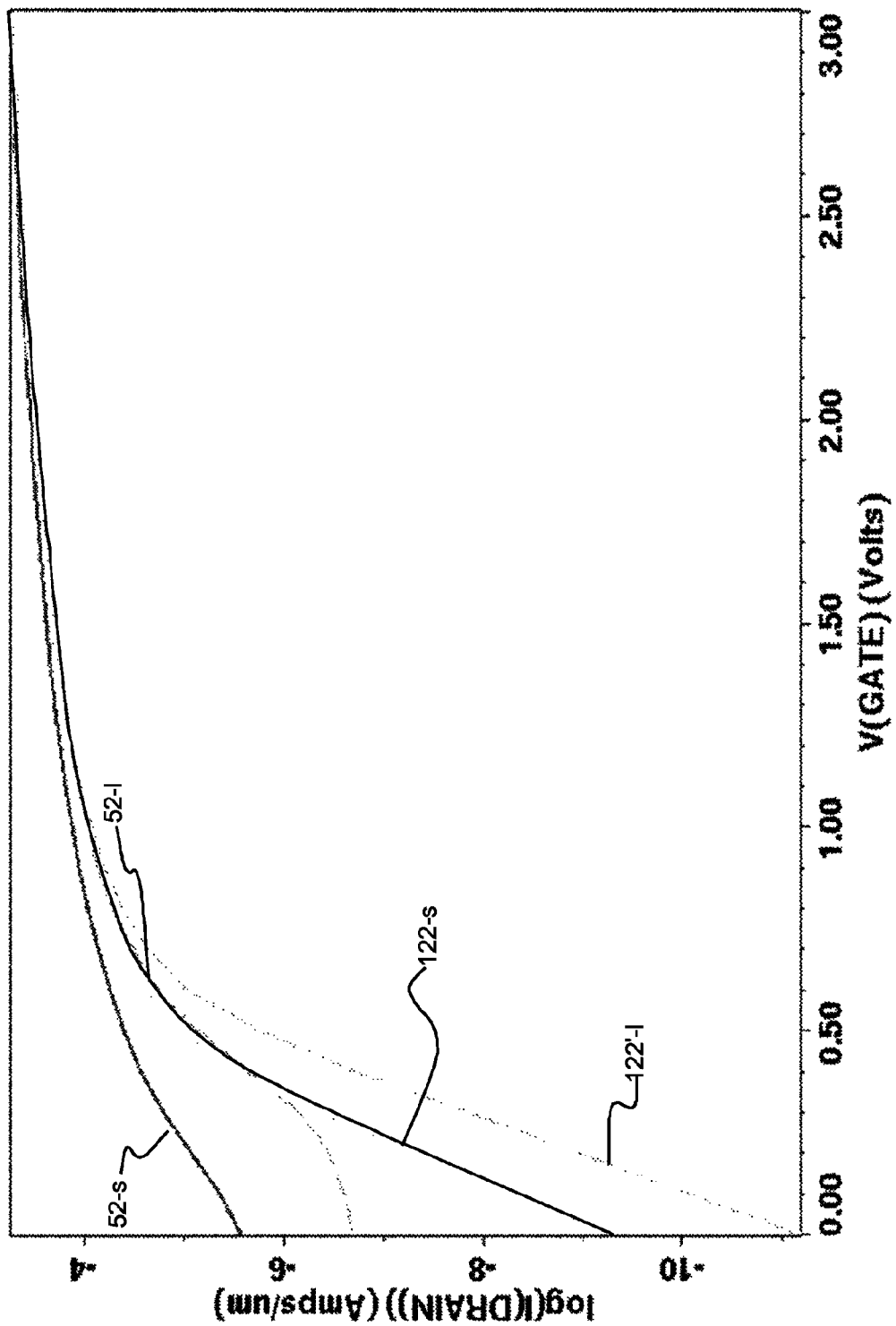

FIGS. 11A-C show a comparison of device I-V characteristics for the preferred devices 122, 122' of FIGS. 8A and B with the typical state of the art device 50 122, 122' of FIG. 1. In particular, FIG. 11A compares transconductance for the 3 described FETs 50, 122, 122' at saturation ($V_{ds} \geq V_{gs} - V_t$, where $V_{ds} = 1V$ in this example and designated -s) and with the devices operating in the linear region ($V_{ds} \leq <V_{gs} - V_t$, where $V_{ds} = 1V$ in this example and designated -1). FIG. 11B shows on a log scale a comparison of thresholds for the typical state of the art device 50 with the first, partially oxidized embodiment 122. FIG. 11C shows on a log scale a comparison of thresholds for the typical state of the art device 50 with the second, IIIVOI FET 122'.

Further, the buried AlAs layer is oxidized locally at each FET 122, 122', but at least beneath the device source/drain regions for reduced device leakage current (e.g., punch-thru). III-V on insulator (IIIVOI) devices 122' may be fabricated, solely or in combination with partially oxidized buried layered devices, and without requiring starting with a semi-insulating substrate, thereby providing flexibility for III-V device fabrication.

Thus advantageously, as shown in this example, the prior art device 50 exhibits 50-s, 50-1 higher leakage current (e.g., from punch-thru) and a relatively soft threshold. By contrast, both the partially oxidized FET 122-s, 122-1, as well as the IIIVOI FET 122'-s, 122'-1, show lower leakage current and higher-crisper $V_t$s, which translates to lower subthreshold leakage. Also, although the I-V curves 122-s, 122-1 and 122'-s, 122'-1 for the two preferred embodiment examples, are substantially identical in the plots, the IIIVOI embodiment 122' exhibits slightly less punch-thru current, which translates to a significant savings at chip level for millions or even billions of FETs.

Also advantageously, opening ohmic metal to semiconductor contacts to, but not penetrating through, the buried oxide, eliminates any potential shorts, i.e., to the substrate. Further, the gate dielectric sidewalls prevent lateral spiking from the contacts to the gate that may otherwise occur. Thus, the gate dielectric sidewalls prevent shorting source/drain contacts to the gate, i.e., eliminating potential gate to source/drain shorts and improving device yield.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming Field Effect Transistors (FETs), said method comprising:
   defining FET locations on a layered semiconductor wafer, one or more defined FETs having exposed channel ends;
   converting portions of a buried layer beneath source/drain contact regions at said exposed channel ends to a dielectric material;
   forming channel end caps on channel sidewalls at opposite said exposed channel ends; and
   forming source/drain contacts to said end caps.

2. A method of forming FETs as in claim 1, wherein defining FET locations comprises forming a gate in each FET location.

3. A method of forming FETs as in claim 2, wherein defining FET locations further comprises forming dielectric sidewalls along each gate.

4. A method of forming FETs as in claim 1, wherein converting portions comprises:
   etching a surface layer to a buried layer of said layered semiconductor wafer; and
   sub-etching an upper portion of said buried layer.

5. A method of forming FETs as in claim 4, wherein converting portions further comprises converting exposed sub-etched surfaces to a dielectric material layer.

6. A method of forming FETs as in claim 4, wherein the surface layer is a Gallium Arsenide (GaAs) layer, the buried layer is Aluminum Arsenide (AlAs) layer and the dielectric material is Aluminum Oxide (AlO).

7. A method of forming FETs as in claim 6, wherein the AlAs is converted to AlO and the AlO layer is greater than half the thickness of at least one FET such that AlO is under the GaAs layer for the entire at least one FET, the at least one FET being a III-V semiconductor on insulator (IIIVOI) device.

8. A method of forming FETs as in claim 5, wherein forming said end caps further comprises filling said source/drain contact regions with semiconductor material to the upper surface of the one or more FET channels.

9. A method of forming FETs as in claim 8, wherein filling said source/drain contact regions comprises:
   forming a metal layer on said layered semiconductor wafer;
   opening said metal layer at the gate of each of one or more defined FETs to electrically separate said gate from said metal layer; and
   forming a semiconductor material source/drain region on remaining portions of said metal layer, said semiconductor material filling said source/drain contact regions to the top surface of the respective FET channel.

10. A method of forming FETs as in claim 1, wherein said FETs are devices in an Integrated Circuit (IC) chip, said source/drain contacts form above, and do not penetrate to the bottom of, said dielectric material in said buried layer, and said method further comprises forming chip wiring connecting said FETs into chip circuits and connecting said chip circuits together.

11. A method of forming Integrated Circuit (IC) chips, said method comprising:
   defining Field Effect Transistor (FET) gates on a layered III-V semiconductor wafer;
   removing said III-V semiconductor surface layer to a buried layer at source/drain regions of one or more defined FETs;
   sub-etching partially through said buried layer at said source/drain regions;
   replacing exposed sub-etched surfaces of said buried layer to a dielectric material layer;
   forming channel end caps on side walls of the etched said III-V semiconductor surface layer;
   filling sub-etched areas with semiconductor material;
   forming source/drain contacts to said source/drain regions, said source/drain contacts being formed above said dielectric material; and
   forming chip wiring to FET gates and source/drain contacts connecting said FETs into chip circuits and connecting said chip circuits together.

12. A method of forming FETs as in claim 11, wherein defining FET gates comprises forming a gate in each FET location and forming dielectric sidewalls along each gate.

13. A method of forming FETs as in claim 12, wherein the surface layer is Gallium Arsenide (GaAs), the buried layer is Aluminum Arsenide (AlAs) and the converted dielectric material is Aluminum Oxide (AlO).

14. A method of forming FETs as in claim 13, wherein the AlO layer is greater than half the thickness of at least one FET such that AlO is under the GaAs surface layer for the entire at least one FET, said at least one FET being a III-V on insulator (IIIVOI) device.

15. A method of forming FETs as in claim 13, wherein filling said sub-etched areas comprises forming a GaAs layer in said source/drain regions filling said sub-etched areas to an upper surface of said GaAS surface layer.

* * * * *